United States Patent [19]
Chisaka

[11] Patent Number: 6,056,785
[45] Date of Patent: May 2, 2000

[54] ELECTRON-BEAM DATA GENERATING APPARATUS

[75] Inventor: Kenichiro Chisaka, Hyogo, Japan

[73] Assignees: Mitsubishi Electric Semiconductor Software Co., Ltd., Hyogo; Mitsubishi Denki Kabushiki Kaisha, Tokyo, both of Japan

[21] Appl. No.: 08/975,164

[22] Filed: Nov. 20, 1997

[30] Foreign Application Priority Data

May 28, 1997 [JP] Japan .................................. 9-138980

[51] Int. Cl.[7] .................................................. G06F 17/50
[52] U.S. Cl. .................................................. 716/19
[58] Field of Search ...................... 364/488, 489, 364/490, 491; 395/500.2, 500.21, 500.22; 716/19, 20, 21

[56] References Cited

U.S. PATENT DOCUMENTS

| | | | |
|---|---|---|---|
| 4,531,191 | 7/1985 | Koyama | 395/500.22 |
| 5,046,012 | 9/1991 | Morishita et al. | 364/468 |
| 5,159,201 | 10/1992 | Frei | 250/492.2 |
| 5,251,140 | 10/1993 | Chung et al. | 364/472.02 |
| 5,253,182 | 10/1993 | Suzuki | 364/489 |
| 5,432,714 | 7/1995 | Chung et al. | 364/525 |
| 5,546,319 | 8/1996 | Satoh et al. | 364/488 |
| 5,812,412 | 9/1998 | Moriizumi et al. | 395/500.22 |

FOREIGN PATENT DOCUMENTS

| | | |
|---|---|---|
| 60-75965 | 4/1985 | Japan . |
| 2-139911 | 5/1990 | Japan . |
| 8-137086 | 5/1996 | Japan . |

*Primary Examiner*—Paul R. Lintz
*Assistant Examiner*—Leigh Marie Garbowski
*Attorney, Agent, or Firm*—Leydig, Voit & Mayer

[57] ABSTRACT

An electron-beam data generating device generates electron-beam data for creating a mask for a layout pattern of a semiconductor integrated circuit. The device includes processing circuits operating in parallel. The electron-beam data generating device also includes a data processing unit for processing, in parallel, the layout pattern based on at least one of several design layers of the semiconductor integrated circuit, the processes used in fabricating the mask, and segments of the mask, each segment serving as an electron-beam radiation region. The parallel processing is achieved by dividing the data processing and assigning each divided portion of the data processing to respective processing circuits. A format converting unit converts data processed by the processing unit into electron-beam data and outputs the electron-beam data.

10 Claims, 8 Drawing Sheets

ELECTRON-BEAM DATA GENERATING APPARATUS

BACKGROUND OF THE INVENTION

1. Field of the Invention

The present invention relates to an electron-beam data generating apparatus for converting layout pattern data into electron-beam data (EB data) for creating a mask to be used in a semiconductor fabrication process.

2. Description of the Prior Art

In order to manufacture a semiconductor integrated circuit (LSI), in general, after the design of the LSI has been completed, a circuit pattern of the LSI is created as a metallic thin film on a glass substrate. The metallic thin film forming the circuit pattern of the LSI is referred to as a mask. Semiconductor devices are then created by transferring the circuit pattern to locations on a silicon wafer sequentially one location after another by using the mask. A mask is created normally by, first of all, converting a circuit pattern resulting from a completed layout design into mask data having a data format readable by a mask drawing apparatus. In the following description, the circuit pattern, data input to the format-conversion process, is referred to as layout-pattern data which has a GDSII STREAM format. On the other hand, mask data output by the conversion is called as EB data.

When the designer creates layout-pattern data, a circuit pattern is entered for each fabrication process. At that time, it is necessary to enter figure data by providing a hierarchy thereto. The hierarchy comprises design layers. A segment is a drawing-region unit of the mask drawing apparatus. A mask is drawn by dividing the pattern of the mask into segment units.

FIG. 8 is a block diagram showing the configuration of a conventional electron-beam data generating apparatus for two design layers, two fabrication processes and two segments. FIG. 9 is a diagram showing an example of an image figure of layout-pattern data. In this example, the number of fabrication processes match the number of design layers. It should be noted, however, that one fabrication process may correspond to a plurality of design layers.

In FIG. 8, reference numerals 1 and 2 denote layout-pattern data and a stream analyzing unit respectively. Reference numeral 3 is a reference sorting unit and reference numeral 4 denotes a hierarchy developing unit. Reference numerals 5 and 6 are a trapezoid division unit and a trapezoid-file sorting unit, respectively. Reference numeral 7 denotes a data compressing unit and reference numeral 8 is a format converting unit. Reference numerals 9a and 9b each denote EB data.

The hierarchy developing unit 4 comprises a hierarchy developing L1 sub-unit 10 and a hierarchy developing L2 sub-unit 11 for developing hierarchies for design layers L1 and L2 respectively. The trapezoid division unit 5 comprises a trapezoid division P1 sub-unit 12 and a trapezoid division P2 sub-unit 13 for carrying out trapezoid division processes on data developed for fabrication processes P1 and P2 respectively. In addition, the trapezoid-file sorting unit 6 comprises a trapezoid-file sorting P1S1 sub-unit 14, a trapezoid-file sorting P1S2 sub-unit 15, a trapezoid-file sorting P2S1 sub-unit 16 and a trapezoid-file sorting P2S2 sub-unit 17 for carrying out trapezoid-file sorting processes for their respective combinations of the two fabrication processes P1 and P2 and segments S1 and S2 each used as a unit of mask-pattern creation. The data compressing unit 7 comprises a data compressing P1S1 sub-unit 18, a data compressing P1S2 sub-unit 19, a data compressing P2S1 sub-unit 20 and a data compressing P2S2 sub-unit 21 for sorting trapezoid files of their respective combinations of the two fabrication processes P1 and P2 and the two segments S1 and S2. The format converting unit 8 comprises a format converting P1 sub-unit 22 and a format converting P2 sub-unit 23 for format conversion to generate the EB data 9a and the EB data 9b of the fabrication processes P1 and P2, respectively.

First of all, from the layout-pattern data 1 created by the designer in the GDSII STREAM format, figure data of the stream data is read out by the stream analyzing unit 2 for each cell. At that time, only data of layers specified by parameter inputs is read in. Further, the stream format is checked and, in addition, data such as cell names and reference information is analyzed.

The reference sorting unit 3 then sorts reference files from the analyzed stream. Subsequently, the hierarchy developing unit 4 develops a cell hierarchical structure for each design layer, creating a flat figure on each of the fabrication processes. Then, the trapezoid division unit 5 carries out a trapezoid division process on the figure having a developed hierarchical structure for each fabrication process. The trapezoid-file sorting unit 6 then carries out a file sorting process on trapezoid data produced by the trapezoid division unit 5 for each segment. Subsequently, the data compressing unit 7 compresses the data for each fabrication process and each segment. Finally, the format converting unit 8 carries out format conversion for each fabrication process to produce a MEBES data format. The processing steps described above result in the EB data 9a and the EB data 9b.

In the hierarchy developing unit 4, the design layer L1 is processed by the hierarchy developing L1 sub-unit 10 and, as the processing is completed, the design layer L2 is processed by the hierarchy developing L2 sub-unit 11. In the trapezoid division unit 5, figures developed by the hierarchy developing unit 4 undergo processing for the fabrication process P1 by the trapezoid division P1 sub-unit 12 and, as the processing is completed, undergo processing for the fabrication process P2 by the trapezoid division P2 sub-unit 13. In the trapezoid-file sorting unit 6, files of the figures completing the trapezoid division processing are sorted by using data such as the X-direction coordinate or a data code resulting from coding of a trapezoidal shape, a stripe or a segment as a key. First of all, processing for the fabrication process P1 and the segment S1 is carried out by the trapezoid-file sorting P1S1 sub-unit 14. When this processing is finished, processing for the fabrication process P1 and the segment S2 is carried out by the trapezoid-file sorting P1S2 sub-unit 15. When this processing is finished, processing for the fabrication process P2 and the segment S1 is carried out by the trapezoid-file sorting P2S1 sub-unit 16. When this processing is finished, processing for the fabrication process P2 and the segment S2 is carried out by the trapezoid-file sorting P2S2 sub-unit 17. In the data compressing unit 7, processing for the fabrication process P1 and the segment S1 is carried out by the data compressing P1S1 sub-unit 18. When this processing is finished, processing for the fabrication process P1 and the segment S2 is carried out by the data compressing P1S2 sub-unit 19. When this processing is finished, processing for the fabrication process P2 and the segment S1 is carried out by the data compressing P2S1 sub-unit 20. When this processing is finished, processing for the fabrication process P2 and the segment S2 is carried out by the data compressing P2S2 sub-unit 21. In the format converting unit 8, processing for the fabrication process P1 is carried out by the format converting P1 sub-unit 22. When this processing is finished, processing for the fabrication process P2 is carried out by the format converting P2 sub-unit 23.

Having a configuration described above, the conventional electron-beam data generating apparatus has a problem that it takes a long time to carry out the processing to convert layout-pattern data into EB data.

SUMMARY OF THE INVENTION

The present invention is implemented to solve the problem described above, and it is thus an object of the present invention to provide an electron-beam data generating apparatus capable of processing data at a high speed.

According to an aspect of the present invention, an electron-beam data generating apparatus for generating electron-beam data comprises a data processing unit for carrying out data processing of a layout pattern based on at least one of design layers, fabrication processes of mask creation and segments each serving as an electron-beam radiation region in parallel by dividing data processing and assigning divided portions of the data processing to a plurality of processing circuits; and a format converting unit for converting a format of data completing the data processing in the data processing unit into a format of the electron-beam data and outputting the electron-beam data. As a result, the electron-beam data generating apparatus has an effect of a capability of processing data at a high speed.

According to another aspect of the present invention, the data processing unit employed in the electron-beam data generating apparatus described above includes a hierarchy developing unit for carrying out hierarchy developing processes on the layout pattern in parallel for the respective design layers by assigning the hierarchy developing processes to the processing circuits. As a result, the electron-beam data generating apparatus has an effect of a capability of processing data at a high speed.

According to still another aspect of the present invention, the data processing unit employed in the electron-beam data generating apparatus described above includes a trapezoid division unit for carrying out trapezoid-division processes on figures of the layout pattern in parallel for the respective fabrication processes by assigning the trapezoid-division processes to the processing circuits and for outputting a plurality of trapezoid files. As a result, the electron-beam data generating apparatus has an effect of a capability of processing data at a high speed.

According to a still further aspect of the present invention, the data processing unit employed in the electron-beam data generating apparatus described above includes a trapezoid-file sorting unit for carrying out pieces of sort processing on the trapezoid files output by the trapezoid division unit by using a predetermined key in parallel for respective combinations of the fabrication processes and the segments each serving as an electron-beam radiation region by assigning the pieces of sort processing to the processing circuits. As a result, the electron-beam data generating apparatus has an effect of a capability of processing data at a high speed.

According to a still further aspect of the present invention, the data processing unit employed in the electron-beam data generating apparatus described above includes a data compressing unit for carrying out data-compression processes on the layout pattern in parallel for respective combinations of the fabrication processes and the segments each serving as an electron-beam radiation region by assigning the data-compression processes to the processing circuits. As a result, the electron-beam data generating apparatus has an effect of a capability of processing data at a high speed.

According to a still further aspect of the present invention, the format converting unit employed in the electron-beam data generating apparatus described above carries out format-conversion processes on data of the layout pattern in parallel for the respective fabrication processes by assigning the format-conversion processes to the processing circuits. As a result, the electron-beam data generating apparatus has an effect of a capability of processing data at a high speed.

BRIEF DESCRIPTION OF THE DRAWINGS

Preferred embodiments of the present invention will be described with reference to figures wherein.

DETAILED DESCRIPTION OF THE PREFERRED EMBODIMENTS

Figure 1:
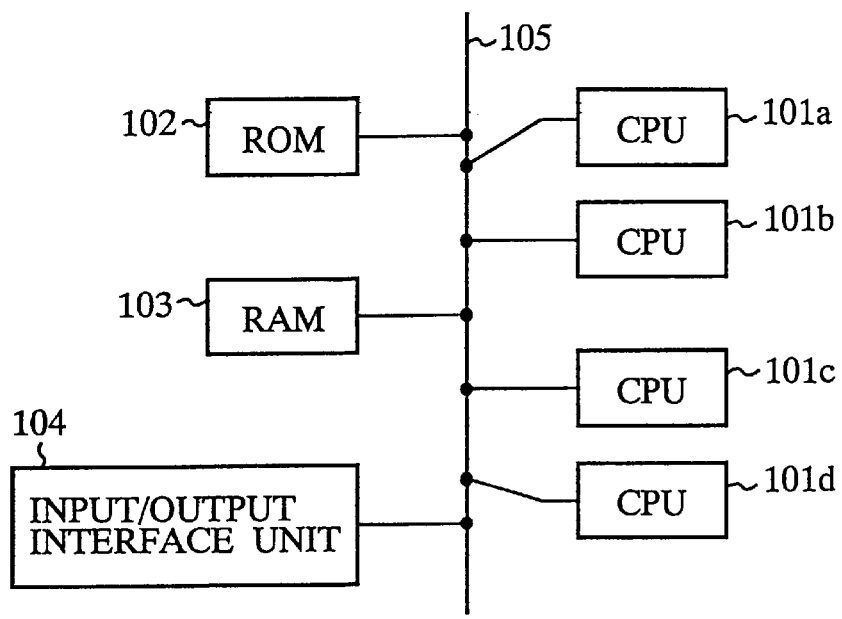
FIG. 1 is a block diagram showing a hardware configuration of an EB data generating apparatus as implemented by an embodiment of the present invention.

The present invention will become more apparent from a study of the following detailed description of some preferred embodiments with reference to the accompanying diagrams.
First Embodiment FIG. 1 is a block diagram showing a hardware configuration of an EB data generating apparatus as implemented by an embodiment of the present invention. As shown in the figure, the EB data generating apparatus implemented by an embodiment of the present invention comprises four CPUs (processing circuits) 101a, 101b, 101c and 101d, a ROM unit 102, a RAM unit 103, an input/output interface unit 104 including a keyboard and a CRT and a data bus 105 for transferring data among these components. In the configuration of the EB data generating apparatus, data processing can be carried out in parallel by the four CPUs.

Figure 2:
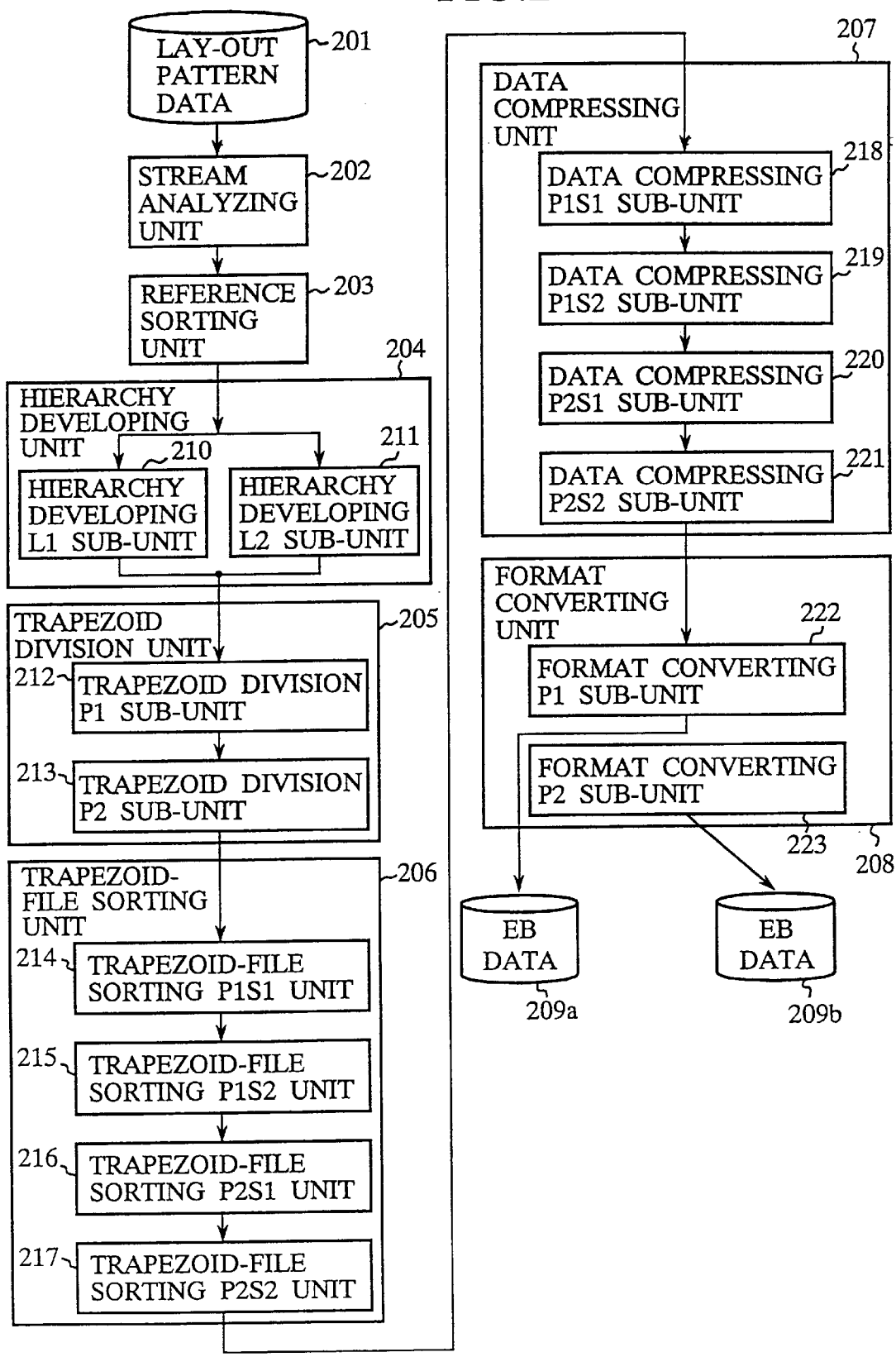
FIG. 2 is a functional block diagram showing an EB data generating apparatus as implemented by a first embodiment of the present invention.

FIG. 2 is a functional block diagram showing an EB data generating apparatus as implemented by a first embodiment of the present invention. In actuality, operations of the first embodiment are implemented by software executed on the hardware shown in FIG. 1.

Figure 9:
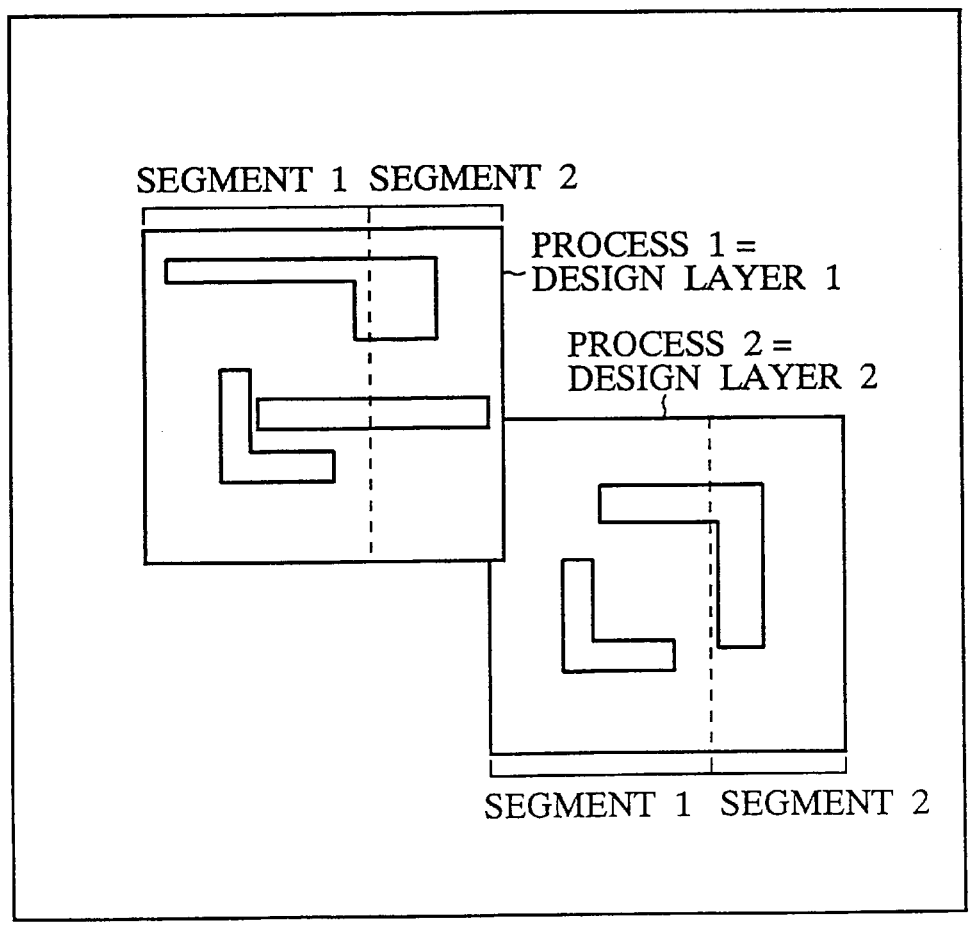
FIG. 9 is a diagram showing an example of image figures of layout-pattern data.

To be more specific, FIG. 2 is a functional block diagram showing the configuration of an EB data generating apparatus as implemented by the first embodiment for two design layers, two fabrication processes and two segments. It should be noted that the first embodiment generates the same typical image figures as the image figures of layout-pattern data of FIG. 9 which is processed by the conventional EB data generating apparatus explained previously.

In FIG. 2, reference numerals 201 and 202 denote layout-pattern data and a stream analyzing unit, respectively. Reference numeral 203 is a reference sorting unit and reference numeral 204 denotes a hierarchy developing unit (data processing unit). Reference numerals 205 and 206 are a trapezoid division unit and a trapezoid-file sorting unit, respectively. Reference numeral 207 denotes a data compressing unit and reference numeral 208 is a format converting unit. Reference numerals 209a and 209b each denote EB data.

It should be noted that the hierarchy developing unit 204 comprises a hierarchy developing L1 sub-unit 210 and a hierarchy developing L2 sub-unit 211 for developing hierarchies in parallel for design layers L1 and L2, respectively. In this case, two of the four CPUs 101a to 101d shown in FIG. 1 are each allocated to one of the two parallel processes for the design layers L1 and L2. In this way, the hierarchies can be developed at a high speed.

In addition, the trapezoid division unit 205 comprises a trapezoid division P1 sub-unit 212 and a trapezoid division P2 sub-unit 213 for carrying out trapezoid division processes on data developed for fabrication processes P1 and P2, respectively. Further, the trapezoid-file sorting unit 206 comprises a trapezoid-file sorting P1S1 sub-unit 214, a trapezoid-file sorting P1S2 sub-unit 215, a trapezoid-file sorting P2S1 sub-unit 216 and a trapezoid-file sorting P2S2 sub-unit 217 for respectively carrying out trapezoid-file sorting processes on the respective combinations of the two fabrication processes P1 and P2 and segments S1 and S2, each used as a unit of mask-pattern creation. The data compressing unit 207 comprises a data compressing P1S1 sub-unit 218, a data compressing P1S2 sub-unit 219, a data compressing P2S1 sub-unit 220 and a data compressing P2S2 sub-unit 221 for sorting trapezoid files of the respective combinations of the two fabrication processes P1 and P2 and the two segments S1 and S2. Finally, the format converting unit 208 comprises a format converting P1 sub-unit 222 and a format converting P2 sub-unit 223 for format conversion to generate the EB data 209a and the EB data 209b for the fabrication processes P1 and P2, respectively.

First of all, from the layout-pattern data 201 created by the designer in the GDSII STREAM format, figure data of the stream data is read out by the stream analyzing unit 202 for each cell. At that time, only data of layers specified by parameter inputs is read in. Further, the stream format is checked and, in addition, data such as cell names and reference information are analyzed.

The reference sorting unit 203 then sorts reference files from the analyzed stream. Subsequently, the hierarchy developing unit 204 develops a cell hierarchical structure for each design layer and fetches reference data onto a fabrication process. Then, data of a cell is made converted into polygon data, creating a flat figure on the fabrication processes.

The trapezoid division unit 205 then carries out a trapezoid division process on the figure having a developed hierarchical structure for each fabrication process. To be more specific, in the trapezoid division process, first of all, the polygon data is divided among specified drawing regions and then divided among segment regions. The data is further divided among stripe regions, regions of division in the vertical direction of the EB format. Figures divided in this way are further divided into trapezoids.

Subsequently, the trapezoid-file sorting unit 206 carries out a file sorting process on trapezoid data produced by the trapezoid division unit 205 for each fabrication process and each segment by using data such as the X-direction coordinate or a data code resulting from coding of a trapezoidal shape, a stripe or a segment as a key. Then, the data compressing unit 207 compresses the data for each fabrication process and each segment. Finally, the format converting unit 208 carries out format conversion for each fabrication process to produce a MEBES data format. The processing described above results in the EB data 209a and the EB data 209b.

In the hierarchy developing unit 204, the design layers L1 and L2 are processed in parallel by the hierarchy developing L1 sub-unit 210 and the hierarchy developing L2 sub-unit 211 respectively by using different CPUs described above. In the trapezoid division unit 205, figures developed by the hierarchy developing unit 204 undergo processing for the fabrication process P1 by the trapezoid division P1 sub-unit 212 and, as the processing is completed, undergo processing for the fabrication process P2 by the trapezoid division P2 sub-unit 213.

In the trapezoid-file sorting unit 206, files of the figures completing the trapezoid division processing are sorted by using data such as the X-direction coordinate or a data code resulting from coding of a trapezoidal shape, a stripe or a segment as a key. To be more specific, first of all, processing for the fabrication process P1 and the segment S1 is carried out by the trapezoid-file sorting P1S1 sub-unit 214. When this processing is finished, processing for the fabrication process P1 and the segment S2 is carried out by the trapezoid-file sorting P1S2 sub-unit 215. When this processing is finished, processing for the fabrication process P2 and the segment S1 is carried out by the trapezoid-file sorting P2S1 sub-unit 216. When this processing is finished, processing for the fabrication process P2 and the segment S2 is carried out by the trapezoid-file sorting P2S2 sub-unit 217.

In the data compressing unit 207, processing for the fabrication process P1 and the segment S1 is carried out by the data compressing P1S1 sub-unit 218. When this processing is finished, processing for the fabrication process P1 and the segment S2 is carried out by the data compressing P1S2 sub-unit 219. When this processing is finished, processing for the fabrication process P2 and the segment S1 is carried out by the data compressing P2S1 sub-unit 220. When this processing is finished, processing for the fabrication process P2 and the segment S2 is carried out by the data compressing P2S2 sub-unit 221. It should be noted that, in the data compression, data of the same type in the X and Y directions is searched for data located at equal intervals to be summarized as iteration data.

In the format converting unit 208, processing for the fabrication process P1 is carried out by the format converting P1 sub-unit 222. When this processing is finished, processing for the fabrication process P2 is carried out by the format converting P2 sub-unit 223. The format converting P1 sub-unit 222 outputs the EB data 209a and the format converting P2 sub-unit 223 produces the EB data 209b.

As described above, according to the first embodiment, since as many hierarchy developing processes as design layers can be carried out in parallel in the hierarchy developing unit 204, the processing time required for carrying out the conversion into EB data can be shortened, allowing fabrication processes having a short process time to be implemented.

Second Embodiment

Figure 3:
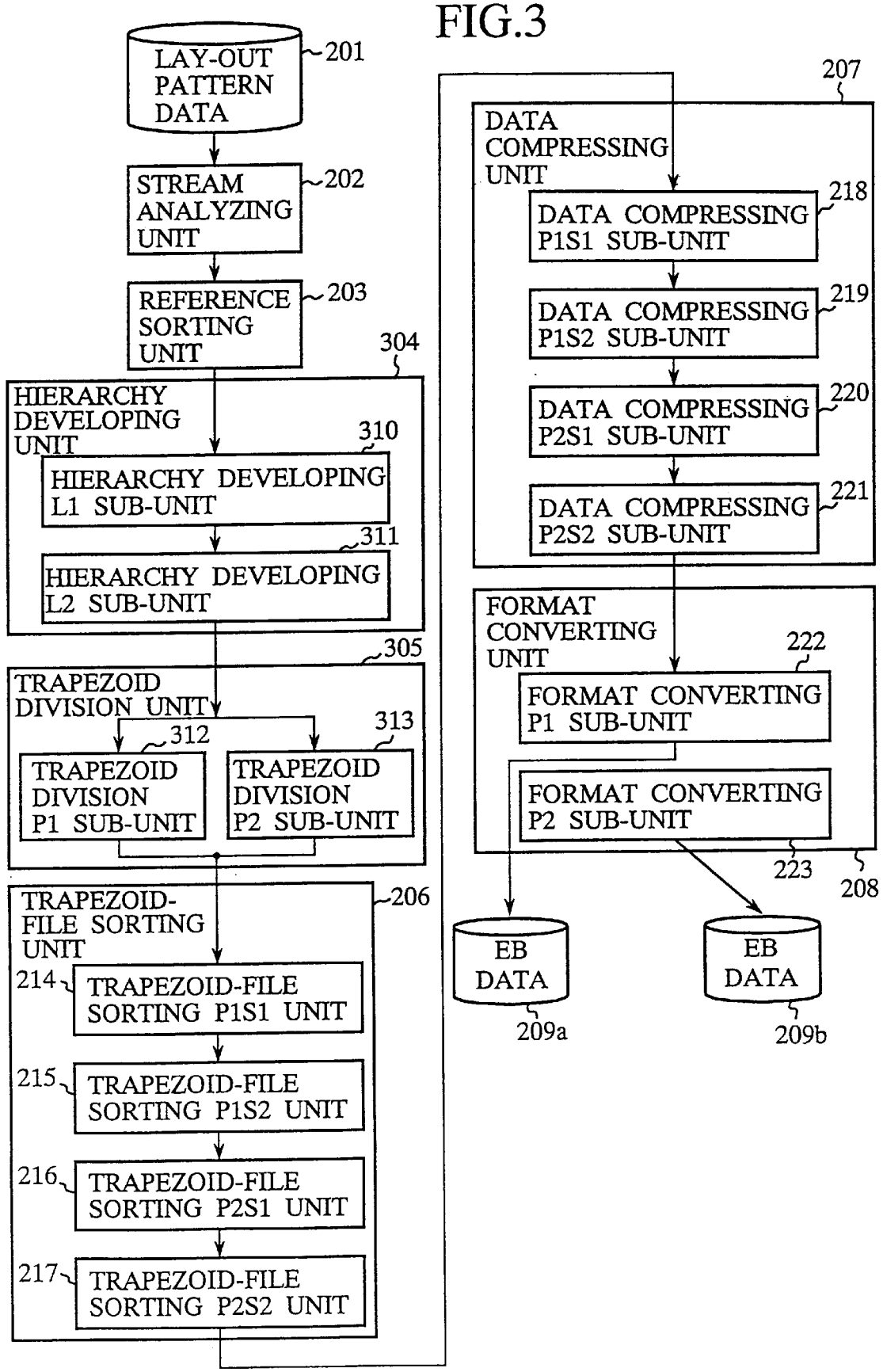
FIG. 3 is a functional block diagram showing an EB data generating apparatus as implemented by a second embodiment of the present invention.

FIG. 3 is a functional block diagram showing an EB data generating apparatus as implemented by a second embodiment of the present invention. Data, units and sub-units in this figure which are identical with or equivalent to those of the first embodiment described earlier are denoted by the same reference numerals for denoting the latter and their description is omitted to avoid duplication of explanation. It should be noted that, like the first embodiment, operations of the second embodiment are also implemented by software executed on the hardware shown in FIG. 1.

The configuration of the second embodiment is different from that of the first embodiment in the following areas. In place of the hierarchy developing unit 204 and the trapezoid division unit 205, a hierarchy developing unit 304 and a trapezoid division unit (data processing unit) 305 are provided, respectively. In the hierarchy developing unit 304, the design layer L1 is processed by a hierarchy developing L1 sub-unit 310 and, as the processing is completed, the design layer L2 is processed by a hierarchy developing L2 sub-unit 311.

In the trapezoid division unit 305, figures with a developed hierarchy output by the hierarchy developing unit 304 undergo trapezoid-division processes in parallel in a trapezoid division P1 sub-unit 312 for carrying out trapezoid division for the fabrication process P1 and a trapezoid division P2 sub-unit 313 for carrying out trapezoid division for the fabrication process P2 by using different CPUs described above. To be more specific, in the trapezoid division process, first of all, the polygon data is divided among specified drawing regions and then divided among segment regions. The data is further divided among stripe regions, regions of division in the vertical direction of the EB format. Figures divided in this way are further divided into trapezoids. Two of the four CPUs 101a to 101d shown in FIG. 1 are each allocated to one of the trapezoid division processes for the fabrication process P1 and the trapezoid division processing for the fabrication process P2 so that the two parts of trapezoid division processes can be carried out in parallel by the two separate CPUs. As a result, due to the parallel execution, processing of data at a high speed can be implemented.

Since parts of the processes which are carried out after the trapezoid division processing are the same as the first embodiment, their explanation is omitted. As described above, according to the second embodiment, since as many trapezoid division processes as fabrication processes can be carried out in parallel in the trapezoid division unit 305, the processing time required for carrying out the conversion into EB data can be shortened, allowing fabrication processes having a short process time to be implemented.

Third Embodiment

Figure 4:
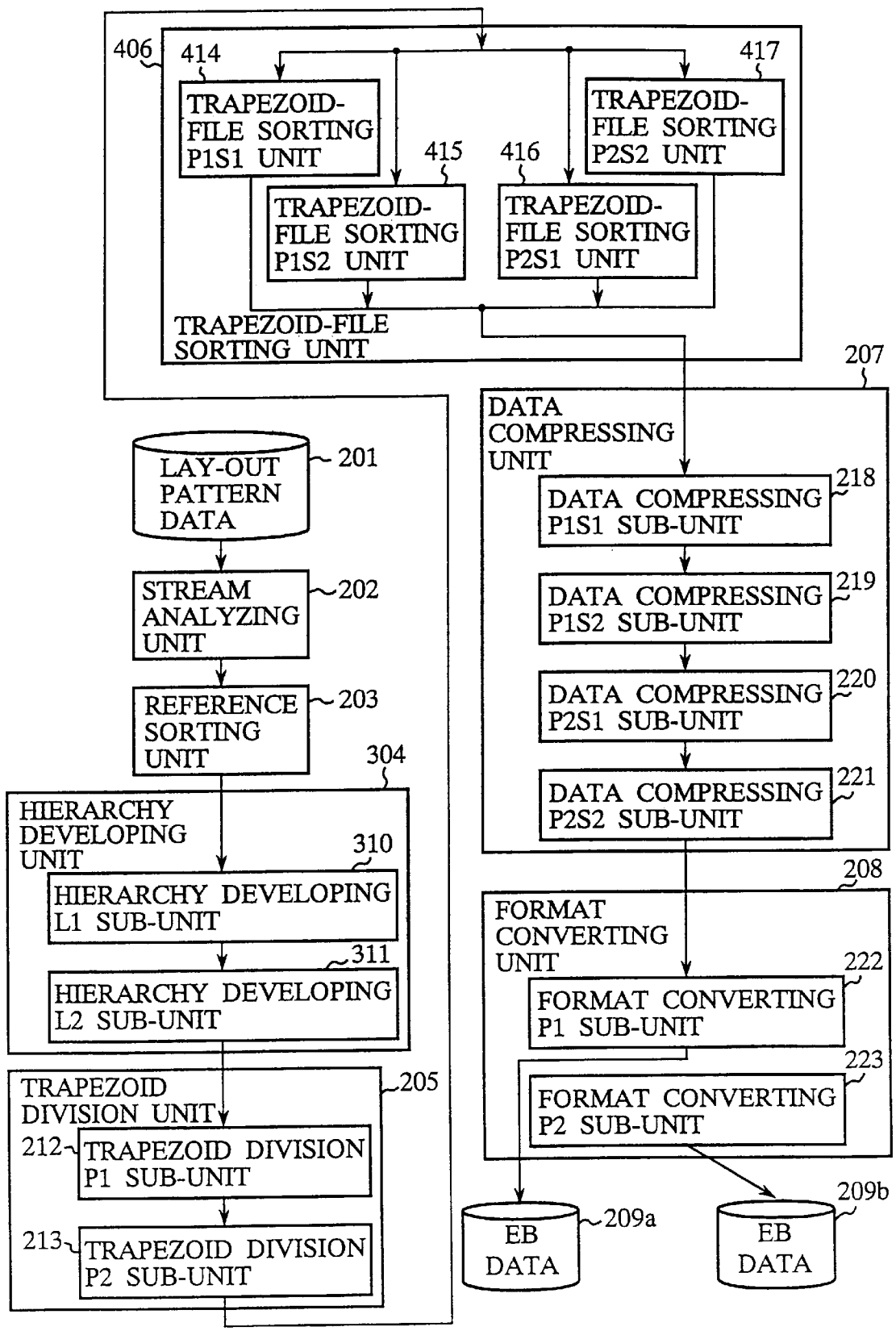
FIG. 4 is a functional block diagram showing an EB data generating apparatus as implemented by a third embodiment of the present invention.

FIG. 4 is a functional block diagram showing an EB data generating apparatus as implemented by a third embodiment of the present invention. Data, units and sub-units in this figure which are identical with or equivalent to those of the first and second embodiments described earlier are denoted by the same reference numerals for denoting the latter and their description is omitted to avoid duplication of explanation. It should be noted that, like the first and second embodiments, operations of the third embodiment are also implemented by software executed on the hardware shown in FIG. 1.

The configuration of the third embodiment is different from that of the first embodiment in the following areas. In place of the hierarchy developing unit 204 and the trapezoid-file sorting unit 206, the hierarchy developing unit 304 and a trapezoid-file sorting unit (data processing unit) 406 are respectively provided. Since the hierarchy developing unit 304 is the same as that of the second embodiment, its description is omitted to avoid duplication of explanation.

The trapezoid-file sorting unit 406 carries out a file sorting process on trapezoid data produced by the trapezoid division unit 205 for each fabrication process and each segment by using data such as the X-direction coordinate or a data code resulting from coding of a trapezoidal shape, a stripe or a segment as a key. To be more specific, in the trapezoid-file sorting unit 406, a trapezoid-file sorting process on trapezoid data is carried out for each combination of the fabrication processes P1 and P2 and the segments S1 and S2. The trapezoid-file sorting processes are carried out for the combinations in parallel by separately allocating the four CPUs 101a to 101d shown in FIG. 1 to the processes.

Since operations carried out by units other than the trapezoid-file sorting unit 406 are the same as those of the first and second embodiments, their description is omitted to avoid duplication of explanation. Operations carried out by the trapezoid-file sorting unit 406 are explained as follows.

Trapezoid files completing trapezoid division in the trapezoid division unit 205 undergo a trapezoid-file sorting process for the fabrication process P1 and the segment S1 in the trapezoid-file sorting P1S1 sub-unit 414, a trapezoid-file sorting process for the fabrication process P1 and the segment S2 in the trapezoid-file sorting P1S2 sub-unit 415, a trapezoid-file sorting process for the fabrication process P2 and the segment S1 in the trapezoid-file sorting P2S1 sub-unit 416 and a trapezoid-file sorting process for the fabrication process P2 and the segment S2 in the trapezoid-file sorting P2S2 sub-unit 417 in parallel. In this case, the four CPUs 101a to 101d shown in FIG. 1 are allocated separately to the pieces of processing carried out in the trapezoid-file sorting P1S1 sub-unit 414, the trapezoid-file sorting P1S2 sub-unit 415, the trapezoid-file sorting P2S1 sub-unit 416 and the trapezoid-file sorting P2S2 sub-unit 417. As a result, data can be processed at a high speed.

As described above, according to the third embodiment, since as many trapezoid-file sorting processes as combinations of fabrication processes and segments can be carried out in parallel in the trapezoid-file sorting unit 406, the processing time required for carrying out the conversion into EB data can be shortened, allowing fabrication processes having a short process time to be implemented.

Fourth Embodiment

Figure 5:
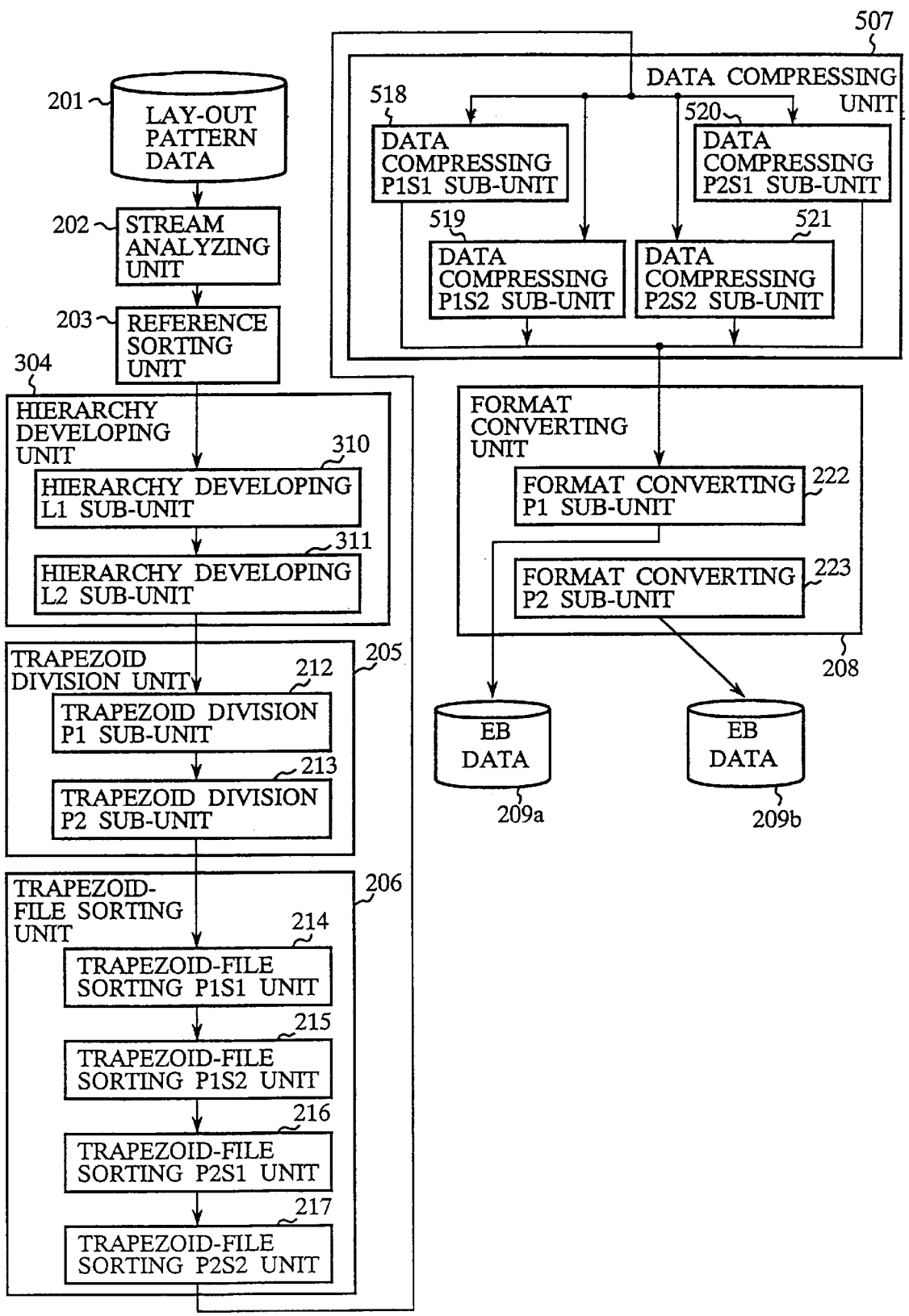
FIG. 5 is a functional block diagram showing an EB data generating apparatus as implemented by a fourth embodiment of the present invention.

FIG. 5 is a functional block diagram showing an EB data generating apparatus as implemented by a fourth embodiment of the present invention. Data, units and sub-units in this figure which are identical with or equivalent to those of the first and second embodiments described earlier are denoted by the same reference numerals for denoting the latter and their description is omitted to avoid duplication of explanation. It should be noted that, much like the first to third embodiments, operations of the fourth embodiment are also implemented by software executed on the hardware shown in FIG. 1.

The configuration of the fourth embodiment is different from that of the first embodiment in the following areas. In place of the hierarchy developing unit 204 and the data compressing unit 207, the hierarchy developing unit 304 and a data compressing unit (data processing unit) 507 are provided respectively. Since the hierarchy developing unit 304 is the same as that of the second embodiment, its description is omitted to avoid duplication of explanation.

The data processing unit 507 compresses figure file data output by the trapezoid-file sorting unit 206. In the data compression, data of the same type in the X and Y directions is searched for pieces of data located at equal intervals to be summarized as iteration data. In the data compressing unit 507, parts of processing to compress sorted trapezoid files are carried out for respective combinations of the fabrication processes P1 and P2 and the segments S1 and S2. The four CPUs 101a to 101d shown in FIG. 1 are separately allocated to the parts of processing so that the parts of processing can be carried out in parallel.

In the data compressing unit 507, data compression for the fabrication process P1 and the segment S1 in the data compressing P1S1 sub-unit 518, data compression for the fabrication process P1 and the segment S2 in the data compressing P1S2 sub-unit 519, data compression for the fabrication process P2 and the segment S1 in the data compressing P2S1 sub-unit 520 and data compression for the fabrication process P2 and the segment S2 in the data compressing P2S2 sub-unit 521 are thus carried out in parallel by different CPUs, that is, the four CPUs 101a to 101d shown in FIG. 1. That is to say, the four CPUs 101 a to 101d shown in FIG. 1 are separately allocated to the parts of processing in the data compressing P1S1 sub-unit 518, the data compressing P1S2 sub-unit 519, the data compressing P2S1 sub-unit 520 and the data compressing P2S2 sub-unit 521 so that the parts of the processes can be carried out in parallel.

As described above, according to the fourth embodiment, since as many parts of data compression processes as combinations of fabrication processes and segments can be carried out in parallel in the data compressing unit 507, the processing time required for carrying out the conversion into EB data can be shortened, allowing fabrication processes having a short process time to be implemented.

Fifth Embodiment

Figure 6:
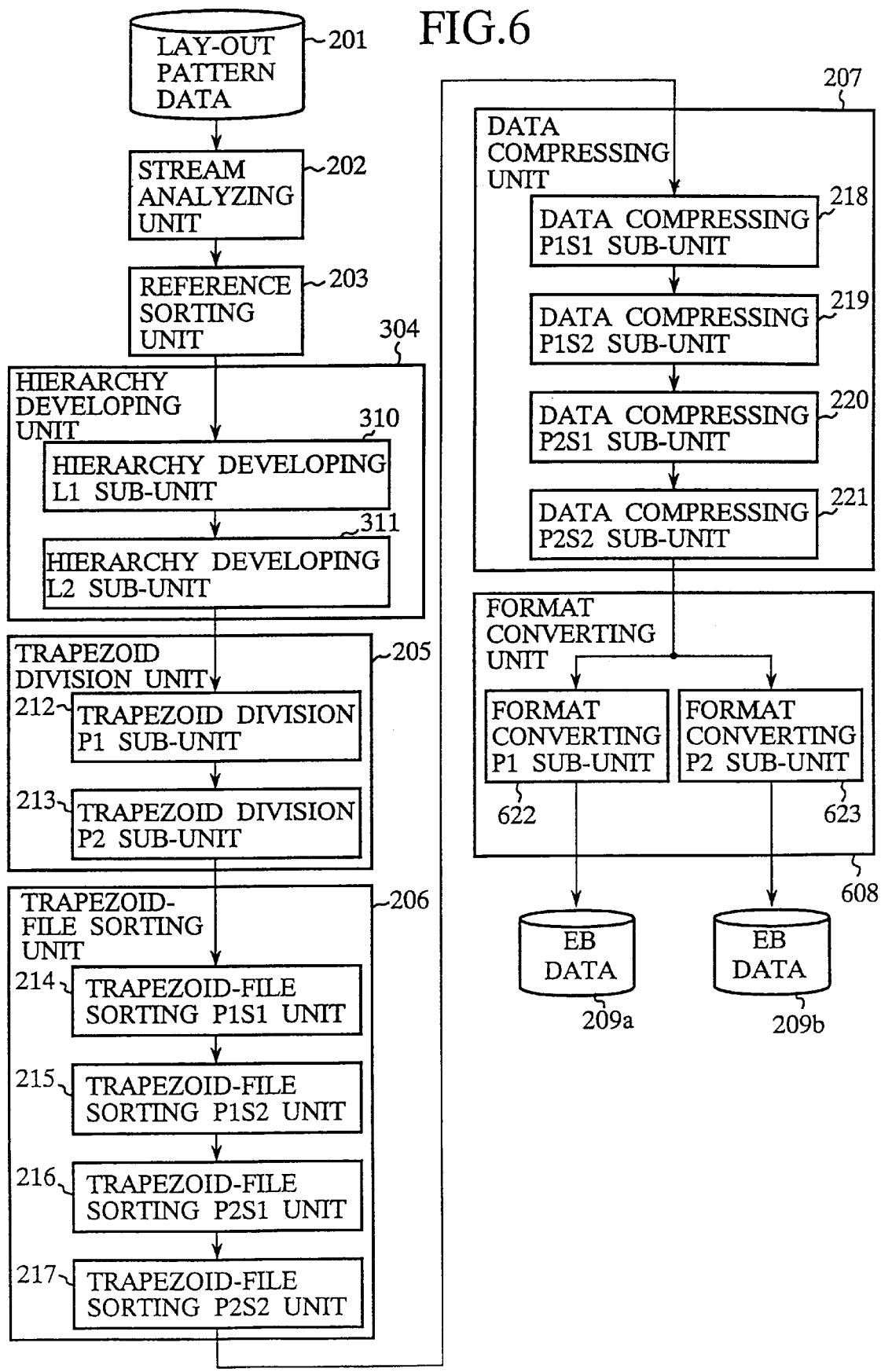
FIG. 6 is a functional block diagram showing an EB data generating apparatus as implemented by a fifth embodiment of the present invention.

FIG. 6 is a functional block diagram showing an EB data generating apparatus as implemented by a fifth embodiment of the present invention. Data, units and sub-units in this figure which are identical with or equivalent to those of the first and second embodiments described earlier are denoted by the same reference numerals for denoting the latter and their description is omitted to avoid duplication of explanation. It should be noted that, like the first to fourth embodiments, operations of the fifth embodiment are also implemented by software executed on the hardware shown in FIG. 1.

The configuration of the fifth embodiment is different from that of the first embodiment in the following areas. In place of the hierarchy developing unit 204 and the format converting unit 208, the hierarchy developing unit 304 and a format converting unit (data processing unit) 608 are provided, respectively. Since the hierarchy developing unit 304 is the same as that of the second embodiment, its description is omitted to avoid duplication of explanation.

The format converting unit 608 comprises a format converting P1 sub-unit 622 and a format converting P2 sub-unit 623 for format conversion to generate the EB data 609a and the EB data 609b for the fabrication processes P1 and P2 respectively. Two of the four CPUs 101a to 101d shown in FIG. 1 are each allocated to one of the format conversion for the fabrication process P1 in the format converting P1 sub-unit 622 and the format conversion for the fabrication process P2 in the format converting P2 sub-unit 623 so that the two format-conversion processes can be carried out in parallel by the two CPUs.

As described above, according to the fifth embodiment, since as many format-conversion processes as fabrication processes can be carried out in parallel in the format converting unit 608, the processing time required for carrying out the conversion into EB data can be shortened, allowing fabrication processes having a short process time to be implemented.

Sixth Embodiment

Figure 7:
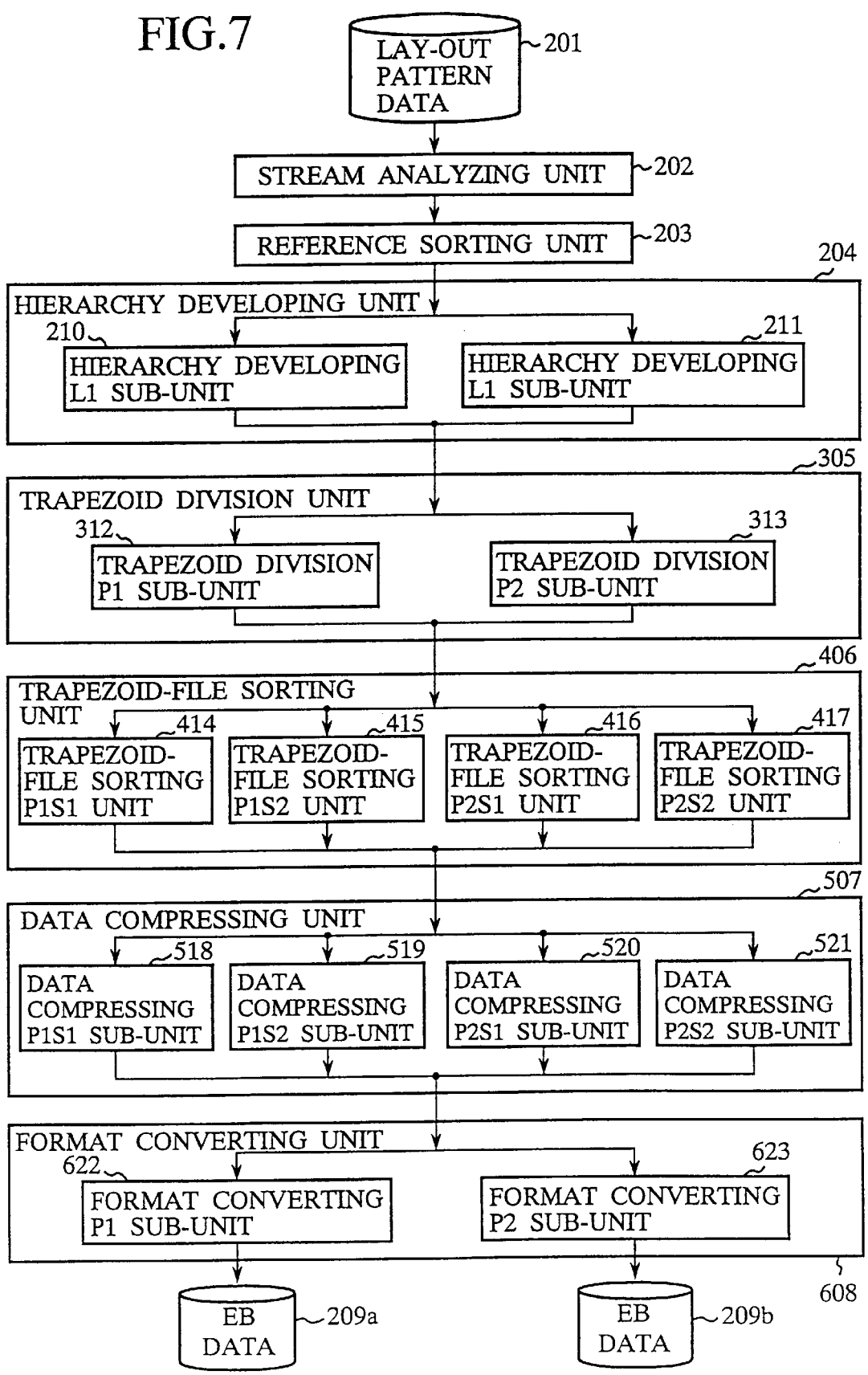
FIG. 7 is a functional block diagram showing an EB data generating apparatus as implemented by a sixth embodiment of the present invention.
Figure 8:
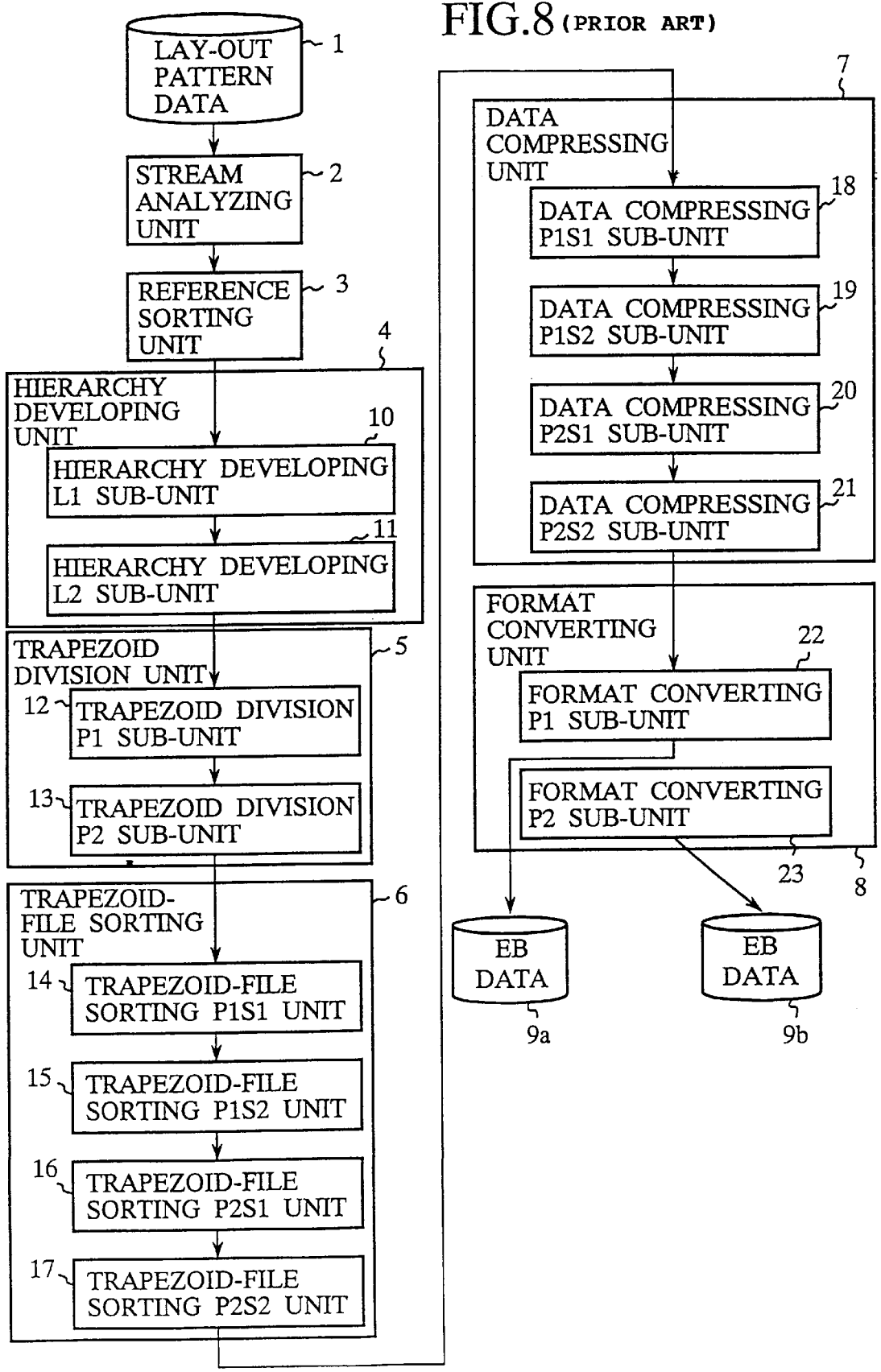
FIG. 8 is a functional block diagram showing a conventional electron-beam data generating apparatus.

FIG. 7 is a functional block diagram showing an EB data generating apparatus as implemented by a sixth embodiment of the present invention. Data, units and sub-units in this figure which are identical with or equivalent to those of the first to fifth embodiments described earlier are denoted by the same reference numerals for denoting the latter and their description is omitted to avoid duplication of explanation. It should be noted that, like the first to fifth embodiments, operations of the sixth embodiment are also implemented by software executed on the hardware shown in FIG. 1.

In the EB data generating apparatus implemented by the sixth embodiment, parts of processes carried out on the layout-pattern data 201 up to the hierarchy development performed by the hierarchy developing unit 204 are the same as those of the first embodiment. Thus, two of the four CPUs 101a to 101d shown in FIG. 1 are each allocated to one of two parts of parallel processes for the design layers.

When the processing carried out in the hierarchy developing unit 204 is finished, in the trapezoid division unit 305 explained in the description of the second embodiment, trapezoid-division processes are carried out in parallel for the respective fabrication processes by separately allocating two of the four CPUs 101a to 101d shown in FIG. 1 to the trapezoid-division processes.

When the processing carried out in the trapezoid division unit 305 is finished, in the trapezoid-file sorting unit 406 explained in the description of the third embodiment, trapezoid-file sorting processes are carried out in parallel for the respective combinations of the fabrication processes and the segments by separately allocating the four CPUs 101a to 101d shown in FIG. 1 to the trapezoid-file sorting processes.

When the processing carried out in the trapezoid-file sorting unit 406 is finished, in the data compressing unit 507 explained in the description of the fourth embodiment, data compressing processes are carried out in parallel for the respective combinations of the fabrication processes and the segments by separately allocating the four CPUs 101a to 101d shown in FIG. 1 to the data compressing processes.

When the processing carried out in the data compressing unit 507 is finished, in the format converting unit 608 explained in the description of the fifth embodiment, data-conversion processes are carried out in parallel for the respective fabrication processes by separately allocating two of the four CPUs 101a to 101d shown in FIG. 1 to the trapezoid-division processes.

As described above, since several parts of processing are carried out in the hierarchy developing unit 204, the trapezoid division unit 305, the trapezoid-file sorting unit 406, the data compressing unit 507 and the format converting unit 608 by separately allocating a plurality of CPUs, processing of data at a high speed can be implemented. It should be noted that, while the sixth embodiment is built by combining components of all the first to fifth embodiments, any combination of components employed in the embodiments such as a combination of those employed in the first and third embodiments or a combination of those employed in the second and fourth embodiments will also allow processing of data at a high speed to be implemented.

In addition, the number of CPUs is not limited to four. It is also possible to implement a configuration employing two, three, five or more CPUs depending on the number of segments, the number of design layers and the number of manufacturing processes.

What is claimed is:

1. An electron-beam data generating apparatus for generating electron-beam data used for creating a mask for a layout pattern of a semiconductor integrated circuit, the apparatus comprising:

a plurality of processing circuits connected in parallel;

a data processing unit for parallel data processing of a layout pattern of a semiconductor integrated circuit based on at least one of design layers of the semiconductor integrated circuit, processes used in fabricating a mask for the layout pattern, and segments, each segment serving as an electron-beam radiation region of the mask, by dividing the data processing and assigning divided portions of the data processing to respective processing circuits, the data processing unit including a hierarchy developing unit for developing, in parallel processing, a hierarchy of the layout pattern for the respective design layers by assigning the developing to respective processing circuits; and a format converting unit for converting data processed by the data processing unit into electron-beam data and outputting the electron-beam data.

2. The electron-beam data generating apparatus according to claim 1 wherein the format converting unit format-converts, by parallel processing, data of the layout pattern for the respective fabrication processes by assigning the format-converting to respective processing circuits.

3. The electron-beam data generating apparatus according to claim 1 wherein the data processing unit includes a trapezoid division unit for dividing, by parallel processing, figures of the layout pattern for the respective fabrication processes, trapezoidally, by assigning the dividing to respective processing circuits and for outputting a plurality of trapezoid files.

4. The electron-bean data generating apparatus according to claim 3 wherein the data processing unit includes a data compressing unit for data-compressing, by parallel processing, the layout pattern for respective combinations of the fabrication processes and the segments by assigning the data-compressing to respective processing circuits.

5. The electron-beam data generating apparatus according to claim 3 wherein the data processing unit includes a trapezoid-file sorting unit for sorting by parallel processing, the trapezoid files output by the trapezoid division unit using a key for respective combinations of the fabrication processes and the segments by assigning the sorting to respective processing circuits.

6. The electron-beam data generating apparatus according to claim 5 wherein the data processing unit includes a data compressing unit for data-compressing, by parallel processing, the layout pattern for respective combinations of the fabrication processes and the segments by assigning the data-compressing to respective processing circuits.

7. The electron-beam data generating apparatus according to claim 5 wherein the format converting unit format-converts, by parallel processing, data of the layout pattern for the respective fabrication processes by assigning the format-converting to respective processing circuits.

8. The electron-beam data generating apparatus according to claim 3 wherein the format converting unit format-converts, by parallel processing, data of the layout pattern for the respective fabrication processes by assigning the format-converting to respective processing circuits.

9. The electron-beam data generating apparatus according to claim 1 wherein the data processing unit includes a data compressing unit for data-compressing, by parallel processing, the layout pattern for respective combinations of the fabrication processes and the segments by assigning the data-compressing to respective processing circuits.

10. The electron-beam data generating apparatus according to claim 9 wherein the format converting unit format-converts, by parallel processing, data of the layout pattern for the respective fabrication processes by assigning the format-converting to respective processing circuits.

* * * * *